(12) United States Patent
Atesoglu et al.

(10) Patent No.: US 9,077,323 B1
(45) Date of Patent: Jul. 7, 2015

(54) LATCHED COMPARATOR CIRCUITRY

(71) Applicant: Altera Corporation, San Jose, CA (US)

(72) Inventors: Ali Atesoglu, Milpitas, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/200,471

(22) Filed: Mar. 7, 2014

Related U.S. Application Data (62) Division of application No. 13/345,384, filed on Jan. 6, 2012, now Pat. No. 8,692,582.

(51) Int. Cl.
*H03K 5/22* (2006.01)
*H03K 3/037* (2006.01)

(52) U.S. Cl.
CPC .................................... *H03K 3/037* (2013.01)

(58) Field of Classification Search
USPC .................................. 327/52, 57, 65, 71, 97
See application file for complete search history.

(56) References Cited

U.S. PATENT DOCUMENTS

| | | | |
|---|---|---|---|
| 4,229,729 A | 10/1980 | Devendorf et al. | |
| 4,511,810 A | 4/1985 | Yukawa | |
| 5,936,434 A | 8/1999 | Kumamoto et al. | |
| 6,215,331 B1 * | 4/2001 | Setty et al. | 327/51 |
| 6,819,137 B1 * | 11/2004 | Wang et al. | 326/68 |
| 6,847,234 B2 * | 1/2005 | Choi | 327/65 |
| 6,950,051 B2 | 9/2005 | Lee et al. | |
| 7,124,221 B1 | 10/2006 | Zerbe et al. | |
| 7,265,596 B2 * | 9/2007 | Kang et al. | 327/161 |
| 7,280,429 B2 * | 10/2007 | Kang et al. | 365/210.1 |
| 7,368,955 B2 | 5/2008 | Kiziloglu et al. | |
| 7,403,045 B2 * | 7/2008 | Wakamatsu et al. | 327/65 |
| 7,501,862 B2 | 3/2009 | Su et al. | |
| 7,679,406 B2 * | 3/2010 | Yagi | 327/57 |
| 7,688,125 B2 | 3/2010 | Payne | |
| 8,134,401 B2 | 3/2012 | Hunter et al. | |
| 8,248,107 B2 | 8/2012 | Ding et al. | |
| 8,797,085 B2 * | 8/2014 | Kakamu et al. | 327/333 |
| 2004/0027265 A1 * | 2/2004 | Michalski | 341/159 |
| 2009/0167362 A1 | 7/2009 | Hsien et al. | |
| 2011/0115529 A1 | 5/2011 | Jansson | |
| 2011/0115538 A1 | 5/2011 | Jansson | |

* cited by examiner

*Primary Examiner* — William Hernandez
(74) *Attorney, Agent, or Firm* — Treyz Law Group; Jason Tsai (57) ABSTRACT

Integrated circuits having analog-to-digital converters are provided. Analog-to-digital converters may contain latched comparators. A latched comparator may include inputs configured to receive a differential input voltage signal, a differential reference voltage signal, and a clock signal. The comparator may include a preamplifier, a latching circuit, a level shifter, and a flip-flop coupled in series. The preamplifier may include large input transistors for minimizing offset, stacked tail transistors, and diode-connected load transistors for minimizing kickback noise. The preamplifier may be used to generate amplified voltage signals. The latching circuit may include a first pair of cross-coupled pull-down transistors, a second pair of cross-coupled pull-up transistors, and precharge transistors. The precharge transistors may serve to precharge the latch output to a predetermined voltage level during a first clock phase, whereas the first and second transistor pairs may serve to perform exponential regeneration on the amplified voltage signals during a second clock phase.

16 Claims, 9 Drawing Sheets

| Thermometer Code | | | | | | | Gray | | | Binary | | |
|---|---|---|---|---|---|---|---|---|---|---|---|---|
| $T_1$ | $T_2$ | $T_3$ | $T_4$ | $T_5$ | $T_6$ | $T_7$ | $G_3$ | $G_2$ | $G_1$ | $B_3$ | $B_2$ | $B_1$ |
| 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 1 | 0 | 0 | 1 |
| 1 | 1 | 0 | 0 | 0 | 0 | 0 | 0 | 1 | 1 | 0 | 1 | 0 |
| 1 | 1 | 1 | 0 | 0 | 0 | 0 | 0 | 1 | 0 | 0 | 1 | 1 |
| 1 | 1 | 1 | 1 | 0 | 0 | 0 | 1 | 1 | 0 | 1 | 0 | 0 |
| 1 | 1 | 1 | 1 | 1 | 0 | 0 | 1 | 1 | 1 | 1 | 0 | 1 |
| 1 | 1 | 1 | 1 | 1 | 1 | 0 | 1 | 0 | 1 | 1 | 1 | 0 |
| 1 | 1 | 1 | 1 | 1 | 1 | 1 | 1 | 0 | 0 | 1 | 1 | 1 |

INPUT TO ENCODER (Thermometer Code); Dout (Gray, Binary)

LATCHED COMPARATOR CIRCUITRY

This application is a division of patent application Ser. No. 13/345,384, filed Jan. 6, 2012, which is hereby incorporated by reference herein in its entirety. This application claims the benefit of and claims priority to patent application Ser. No. 13/345,384, filed Jan. 6, 2012.

BACKGROUND

Integrated circuits often include data converters such as analog-to-digital (A/D) converters. An analog-to-digital converter is a device that is configured to convert a continuous (analog) signal to a discrete time digital signal. For example, an analog-to-digital converter can be used to convert an input analog voltage (or current) to a corresponding digital representation that is proportional to the magnitude of the input voltage.

There are many different types of analog-to-digital converters. As examples, the different implementations include flash A/D converters, single-slope A/D converters, dual-slope A/D converters, successive approximation A/D converters, pipeline A/D converters, oversampled A/D converters, etc. A majority of these A/D converters includes some type of comparator circuitry. Comparators are fundamental building blocks of A/D converters. A comparator is a circuit that has a first input that receives a first input signal, a second input that receives a second input signal, an output, and power supply terminals (i.e., terminals on which a positive power supply voltage and a ground power supply voltage are provided). The comparator will drive its output signal high or low depending on whether the first input signal is greater or less than the second input signal. For example, if the first input signal is greater than the second input signal, the comparator will drive the output signal to the positive power supply voltage level (i.e., a logic "1"). If the first input signal is less than the second input signal, the comparator will drive the output signal to the ground power supply voltage level (i.e., a logic "0").

A comparator can therefore be defined as a high gain amplifier having a differential analog input and a large swing output (i.e., the output signal should be able to swing from the ground power supply voltage all the way up to the positive power supply voltage and vice versa). A conventional comparator is formed using multiple amplifiers cascaded in a chain (i.e., multiple open loop amplifiers connected in series).

It is generally desirable to provide a comparator with high bandwidth. Cascading an increasing number of amplifier stages yields a greater bandwidth for the comparator. Cascading many amplifier stages to increase bandwidth may, however, lower the gain at each amplifier stage. A decrease in the gain of each amplifier stage may undesirably result in the comparator experiencing increased input-referred offset (i.e., the comparator may suffer from inaccuracies when performing comparisons between the first and second input signals). This necessitates the need for offset-cancellation techniques, which requires additional compensation circuitry to be formed on the integrated circuit. Moreover, the use of multiple amplifier stages may consume a substantial amount of power during operation of the integrated circuit.

SUMMARY

Integrated circuits may include data converters such as analog-to-digital converters. There are many different types of analog-to-digital (A/D) converters such as flash A/D converters, single-slope A/D converters, dual-slope A/D converters, successive approximation A/D converters, pipeline A/D converters, oversampled A/D converters, etc. A majority of these A/D converters may include at least a latched comparator.

A latched comparator may have a first set of inputs configured to receive a differential input signal, a second set of inputs configured to receive a differential reference signal, a control input configured to receive a clock (latching) signal, and an output. The latched comparator may be used to drive its output high if the differential input signal is greater in magnitude than the differential reference signal or may be used to drive its output low if the differential input signal is lesser in magnitude than the differential reference signal.

The latched comparator may include at least a preamplifier, a latch, a level shifter, and a flip-flop coupled in a chain. The latch and flip-flop may be controlled using the clock signal. The preamplifier may include a first set of matching input transistors configured to receive the differential input signal and a second set of matching input transistors configured to receive the difference reference signal. The first and second set of matching input transistors may be connected at a shared tail node. At least two transistors may be coupled in series between the tail node and a ground power supply line for providing increased small signal impedance at the tail node. The preamplifier may also include first and second sets of pull-up transistors connected to its output. The first and second sets of pull-up transistors may each include a diode-connected transistor for minimizing kickback noise and may include a cross-coupled pair for maximizing preamplifier gain.

The latch may include a first latch portion containing pull-up transistors and a second latch portion containing pull-down transistors. Switches that are controlled using the clock signal may be turned on to electrically connect the first and second latch portions and may be turned off to decouple the first and second latch portions. The first latch portion may include transistors that are coupled to the output of the preamplifier and may include a first latch cross-coupled pull-up transistor pair.

The second latch portion may include precharge transistors configured to precharge the latch output to a predetermined voltage level and may include a second latch cross-coupled pull-down transistor pair. During a first (high) clock phase of the clock signal, the first and second portions may be decoupled from one another and the latch precharge transistors may be turned on to precharge the latch output to the predetermined voltage level (e.g., to a logic high, a logic low, or an intermediate voltage level). During a second (low) clock phase of the clock signal, the first and second portions may be electrically connected, and the first and second cross-coupled transistor pairs may serve to provide exponential regeneration for the latch (e.g., to drive any voltage difference presented at the output of the preamplifier to a logic "1" or a logic "0") while the precharge transistors are turned off.

Further features of the present invention, its nature and various advantages will be more apparent from the accompanying drawings and the following detailed description.

DETAILED DESCRIPTION

Embodiments of the present invention relate to integrated circuits with data converters. The integrated circuits may be digital signal processors, microprocessors, application specific integrated circuits (ASICs), programmable logic device integrated circuits (PLDs), or other types of integrated circuits.

Figure 1:
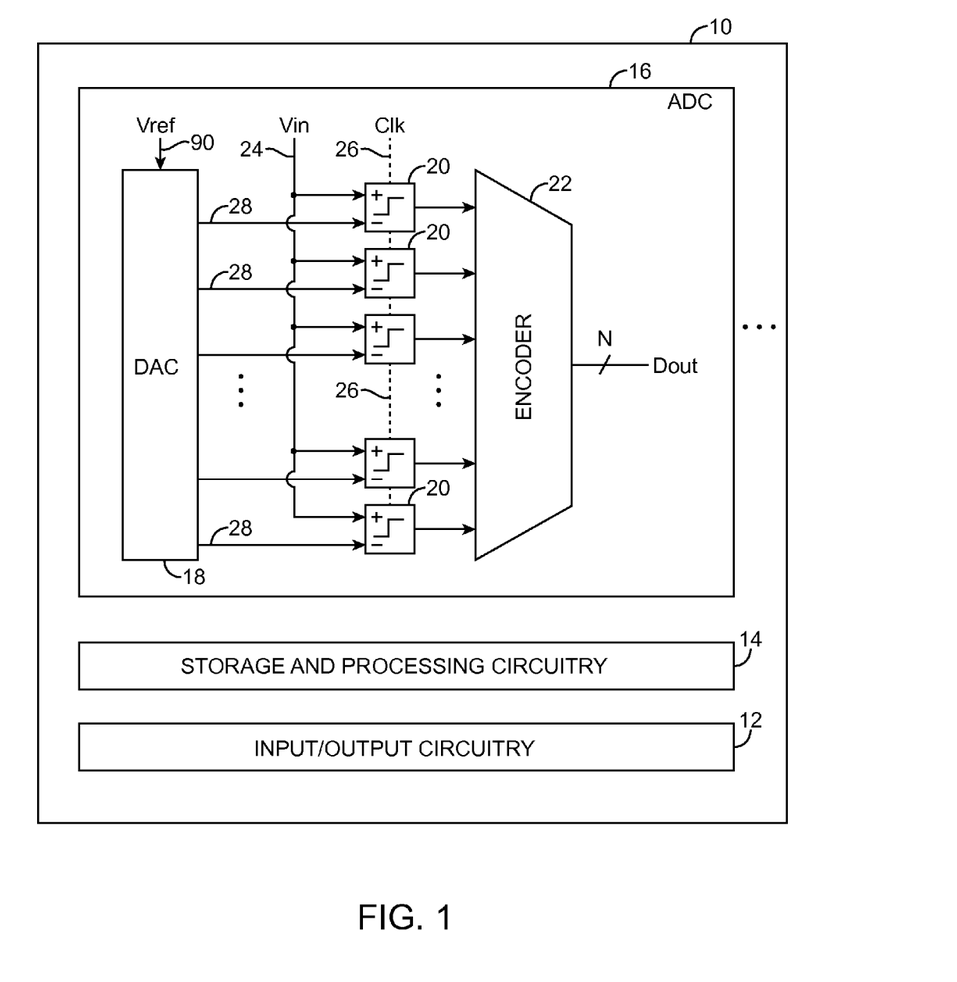
FIG. 1 is a diagram of an illustrative integrated circuit having at least one analog-to-digital converter in accordance with an embodiment of the present invention.

FIG. 1 is a diagram of an integrated circuit 10 that includes input-output (I/O) circuitry 12, storage and processing circuitry 14, and at least one analog-to-digital converter (ADC) 16. Input-output circuitry 12 may include driver circuits configured to drive signals off of device 10 via input-output pins, phase alignment circuits configured to receive signals from other devices via the input-output pins, electrostatic discharge (ESD) protection circuitry configured to limit the amount of electrostatic current that flows through the input-output pins for preventing damage due to electrostatic discharge events, decoupling capacitor circuitry configured to serve as an energy reserve during dynamic switching operations (e.g., to help provide more stable power supply voltages), and other suitable input-output circuitry.

Storage and processing circuitry 14 may include one or more different types of storage such as nonvolatile memory (e.g., flash memory or other electrically-programmable-read-only memory), volatile memory (e.g., static or dynamic random-access-memory), data registers, and/or other suitable types of memory. Storage and processing circuitry 14 may also include logic circuits such as combinatorial logic circuits and sequential logic circuits, digital signal processing modules, radio-frequency processing modules (e.g., wireless communications circuitry such as baseband circuits, power amplifiers, low noise amplifiers, filters, etc.), power management circuits, control circuits such as lookup tables, multiplexers, encoders/decoders, counters, adders, multipliers, and other arithmetic logic circuits, etc. Circuitry 14 may also include control circuitry operable to control the interaction among the different circuitry on device 10 and other suitable digital and analog processing circuits.

As shown in FIG. 1, device 10 may include at least one analog-to-digital (A/D) converter 16 (sometimes abbreviated as ADC). Converter 16 may be considered to be part of storage and processing circuitry 14. In general, device 10 may include a plurality of analog-to-digital converters 16, a plurality of digital-to-analog converters (DACs), and associated digital signal processing circuits (e.g., sample-and-hold circuits, digital filters, analog filters, encoding/decoding circuits, etc.). Different types of integrated circuits may utilize different A/D converter architectures. Different analog-to-digital converter implementations includes flash A/D converters, single-slope A/D converters, multi-slope A/D converters, successive approximation A/D converters, pipeline A/D converters, oversampled A/D converters, etc.

In the example shown in FIG. 1, device 10 may include a flash A/D converter 16. In general, flash A/D converters offer high speed operation at relatively high resolutions (e.g., up to eight-bit precision). Analog-to-digital converter 16 may include a digital-to-analog converter (DAC) 18 having a given number of outputs 28, a corresponding number of comparator circuits 20, and an encoding circuit (encoder) 22. Circuit 18 may be supplied with a reference power supply voltage Vref over power supply line 90 and may have respective outputs 28 at which varying levels of intermediate reference voltages are provided.

Each comparator circuit 20 may include a first (positive) input at which an input voltage Vin is received over path 24, a second (negative) input configured to receive a selected one of the intermediate reference voltages Vref<k> from circuit 18, a control input that receives clock signal Clk over path 26, and an output. Comparator circuit 20 may be used to determine whether the voltage level at its first input is greater than or less than the voltage level at its second input (e.g., to determine whether Vin is greater or less than Vref<k>).

During a first (high) clock phase of control signal Clk, comparator circuit 20 may linearly amplify any voltage difference between Vin and selected reference voltage Vref<k>. During a second (low) clock phase of Clk, comparator circuit 20 may exponentially regenerate the amplified voltage difference (e.g., circuit 20 will drive its output to logic "1" if Vin is greater than Vref<k> and will drive its output to logic "0" if Vin is less than Vref<k>). The result may be latched at its output at the following clock edge (e.g., at the subsequent falling clock edge). Comparator circuit 20 controlled using clock signal Clk in this way may sometimes be referred to as a latched comparator.

Encoder circuit 22 may have inputs coupled to the outputs of comparators 20 and may have an output on which digital signal Dout is generated. The value of signal Dout may be proportional to the voltage magnitude of Vin. For example, consider a scenario in which A/D converter 16 is an eight-bit A/D converter (i.e., Dout is an eight-bit wide digital signal), is supplied with reference supply voltage Vref that is equal to 1 V, and receives an input voltage Vin that is currently equal to 0.78 V. In this example, DAC 18 may be formed as a resistive ladder that includes $2^8$ resistors (see, e.g., FIG. 2).

Figure 2:
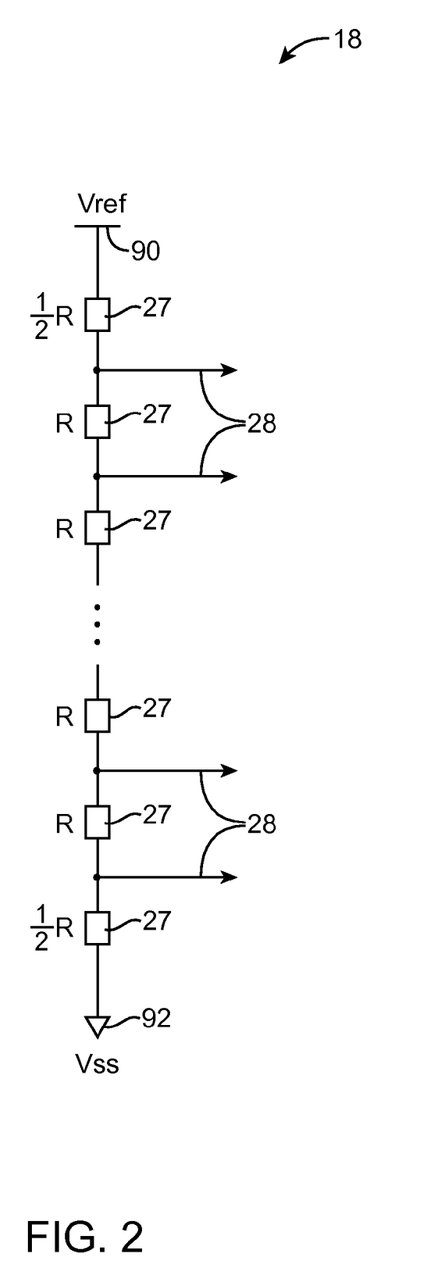
FIG. 2 is a diagram of an illustrative digital-to-analog converting circuit that can be used in the analog-to-digital converter of FIG. 1 in accordance with an embodiment of the present invention.

As shown in FIG. 2, DAC 18 may include 256 resistors coupled in series between reference power supply line 90 and ground power supply line 92 (e.g., a ground power supply line on which ground power supply signal Vss is provided). The topmost resistor 27 that is directly connected to power supply line 90 and the bottommost resistor 27 that is directly connected to power supply line 92 may have a resistance of R/2, whereas each of resistors 27 that is coupled between the topmost resistor and the bottommost resistor exhibits a resistance of R. The node at which each pair of adjacent resistors 27 connect may formed an intermediate tap point for DAC 18.

The intermediate tap points may be couple to respective output paths 28 over which a predetermined pattern of voltage levels is provided.

In this example, there may be 255 output paths 28 ($2^8$ minus 1), where a voltage level Vref<0> at first output path 28 (i.e., an output path that taps into the intermediate node between the bottommost resistor and a second resistor that is adjacent to the bottommost resistor) is equal to equal to 1.96 mV (0.5/255*Vref), where a voltage level Vref<1> at second output path 28 (i.e., an output path that taps into the intermediate node between the second resistor and a third resistor that is adjacent to the second resistor) is equal to 5.88 mV (1.5/255*Vref), . . . , where a voltage level Vref<254> of $255^{th}$ output path 28 (i.e., an output path that taps into the intermediate node between the topmost resistor and a resistor that is adjacent to the topmost resistor) is equal to 998 mV (254.5/255*Vref). The eight-bit A/D converter in this example therefore exhibits a least significant bit (LSB) resolution of 3.92 mV (Vref/255). In other words, DAC 18 may be used to generate a range of voltage levels spaced apart at desired step sizes (e.g., the difference between Vref<k+1> and Vref<k> is equal to the LSB spacing of A/D converter 16). DAC 18 may also be formed using capacitive circuits or other suitable resistive circuits, if desired.

As described previously, each comparator 20 may receive one of intermediate reference voltages Vref<k> over a corresponding path 28 at its second input. Each comparator circuit 20 may receive input voltage signal Vin at its first input. Consider an example in which the exemplary eight-bit A/D converter 16 described above receives a Vin that is equal to 0.75 V. The 64 topmost output paths 28 will carry intermediate reference voltages that are greater than Vin (e.g., Vref<254:191> are greater than 0.75 V), whereas the 191 remaining output paths 28 will carry intermediate reference voltages that are less than Vin (e.g., Vref<190:0> are less than 0.75 V). In this example, Vref<191> may be equal to 751 mV (191.5/255*1). As a result, the top 64 comparators 20 may generate logic zeroes at their outputs while the bottom 191 comparators 20 may generate logic ones at their outputs. An output pattern in which a group of logic "0s" (where the most significant bits are zeroes) is followed by a group of logic "1s" (where the least significant bits are ones) may be referred to as a thermometer code representation (e.g., a base one numerical counting system).

Figure 3:
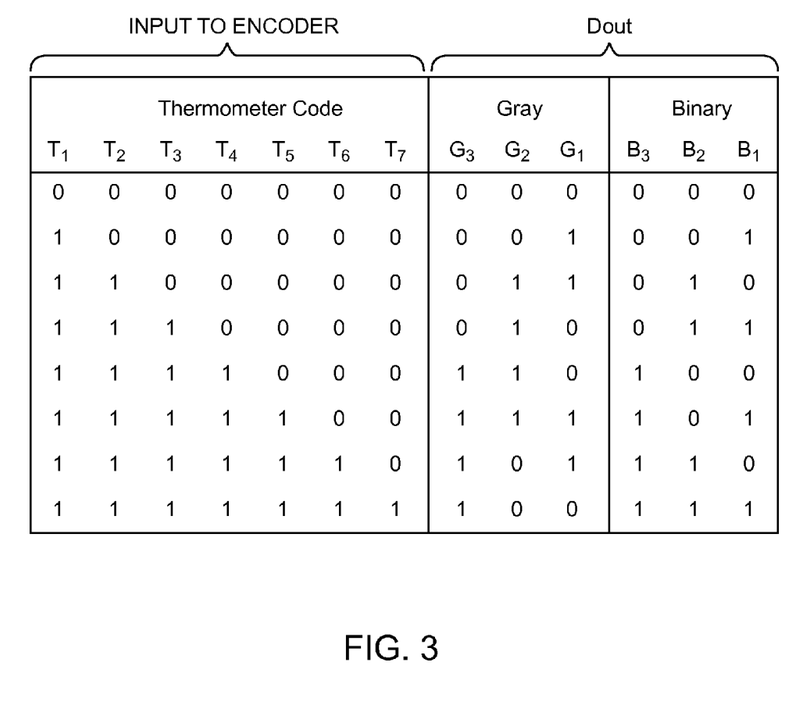
FIG. 3 is a table of illustrative encoding schemes that can be used by the analog-to-digital converter of FIG. 1 in accordance with an embodiment of the present invention.

Encoder 22 may be used to convert thermometer code based signals into other numerical representations such as binary-code based signals, gray-code based signals, or other signals with other encoding schemes (see, e.g., FIG. 3). As shown in FIG. 3, encoder 22 may receive an eight-bit thermometer code based signal and may convert the eight-bit signal into a three-bit gray code based signal Dout or a three-bit binary code based signal Dout. In the 8-bit A/D converter example described in connection with FIG. 1, encoder 22 may receive a 255-bit thermometer code based signal at its input and may output an eight-bit binary coded based signal at its output. In general, encoder 22 may convert the thermometer code based signals generated using comparators 20 using any desired encoding scheme.

A/D converter 16 arranged using the exemplary configuration of FIG. 1 offers high performance by requiring only one clock cycle per conversion. Latched comparator circuits 20 can serve as an important building block for many different types of data converters.

Figure 4:
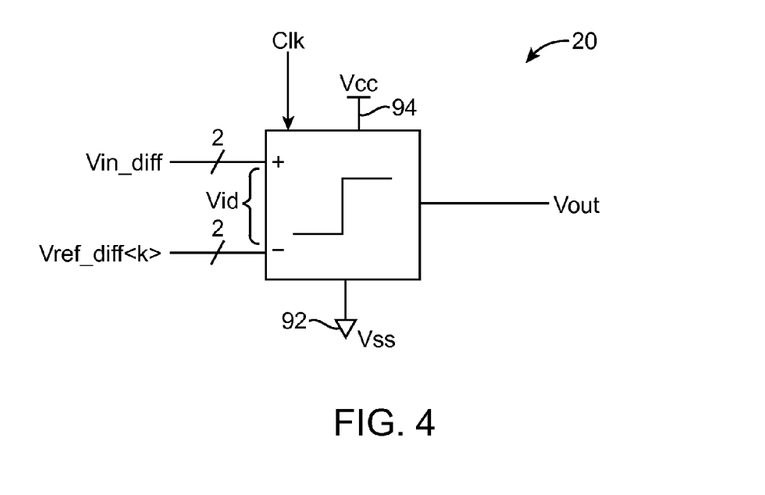
FIG. 4 is a high-level diagram of an illustrative latched comparator circuit in accordance with an embodiment of the present invention.

FIG. 4 shows a high level block diagram of a latched comparator 20. As shown in FIG. 4, latched comparator 20 may have a first (positive) input configured to receive a differential input voltage Vin_diff, a second (negative) input configured to receive a differential intermediate reference voltage Vref_diff<k>, a control input configured to receive clock signal Clk, power supply terminals for receiving voltages Vcc and Vss, and an output on which signal Vout is provided. The difference between voltages Vin_diff that is received at the first input and Vref_diff<k> that is received at the second input may be referred to as a comparator differential input voltage Vid (e.g., Vid may be equal to Vin_diff minus Vref_diff<k>).

Figure 5:
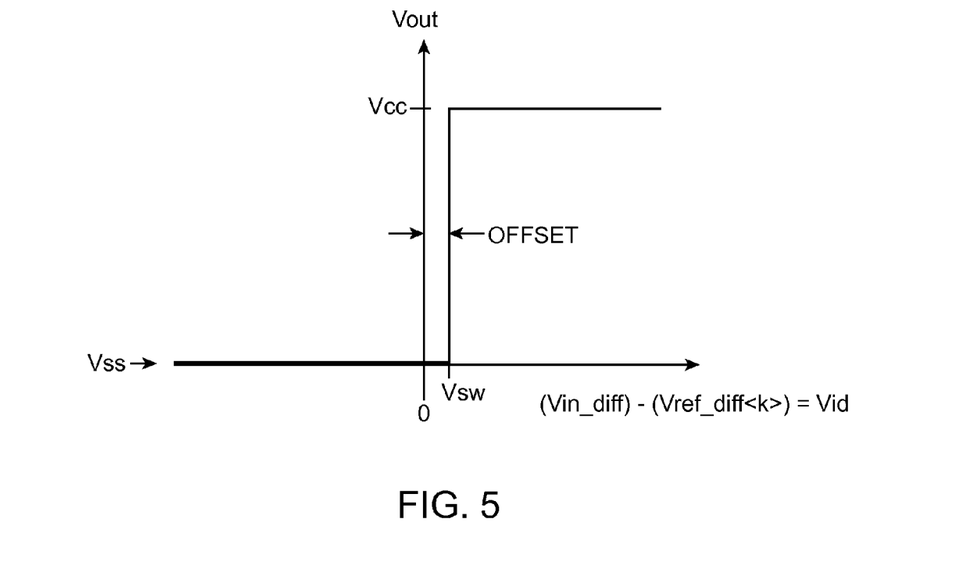
FIG. 5 is a plot of output voltage versus an input differential voltage illustrating the operation of a latched comparator circuit in accordance with an embodiment of the present invention.

FIG. 5 is a plot of output voltage Vout versus comparator differential input voltage Vid. As shown in FIG. 5, comparator 20 is configured to drive Vout low when Vid is less than a switching threshold Vsw and is configured to drive Vout high when Vid is greater than Vsw. Ideally, threshold Vsw should be equal to zero volts. In the presence of process variations and manufacturing non-idealities, however, Vsw can sometimes shift to a positive value (as shown FIG. 5) or to a negative value due to transistor mismatch. This undesirable shift is sometimes referred to as a comparator offset.

Figure 6:
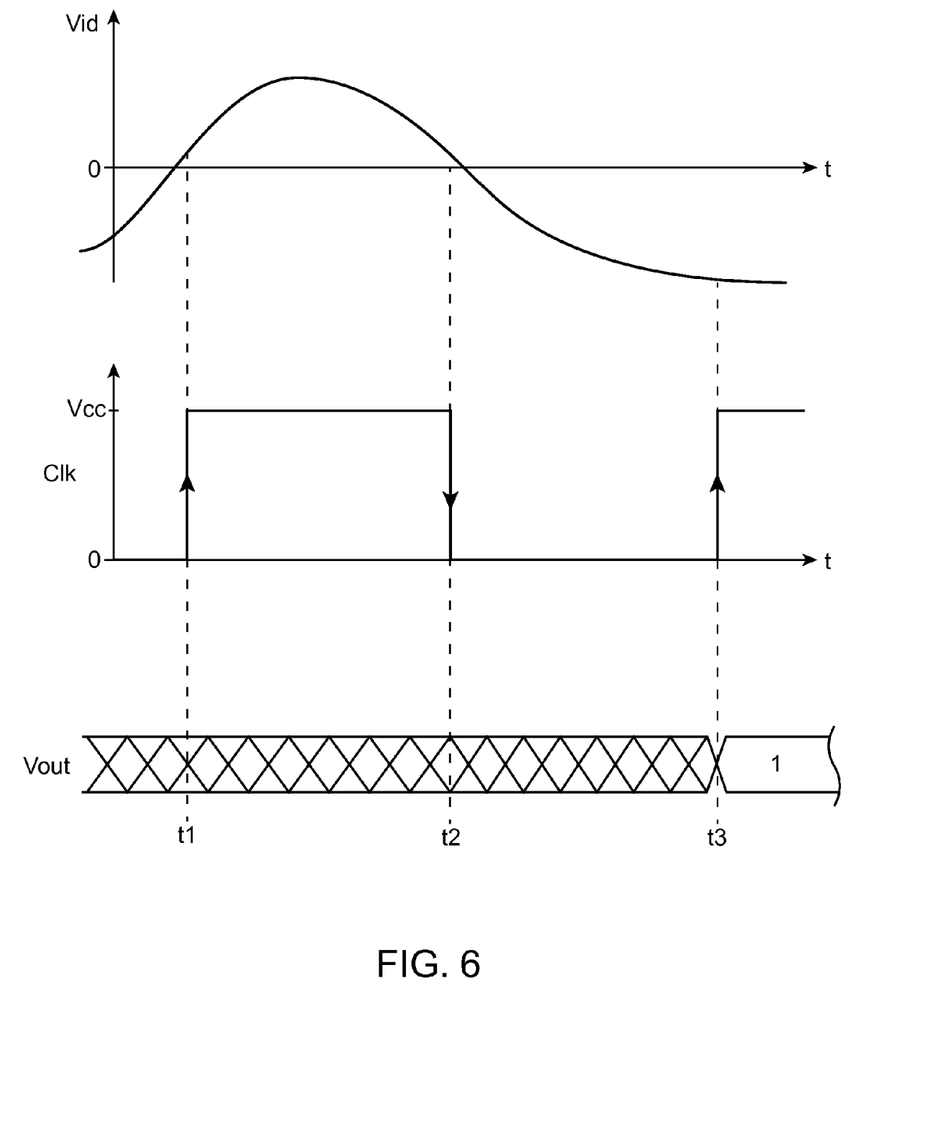
FIG. 6 is a timing diagram showing relevant waveforms during operation of a latched comparator circuit in accordance with an embodiment of the present invention.

FIG. 6 is a timing diagram illustrating the operation of latched comparator 20. As shown in FIG. 5, comparator differential input voltage Vid may be a time-varying analog voltage signal. Assuming that switching threshold Vsw is equal to zero volts, voltage Vid may sometimes be greater than zero volts or may sometimes be less than zero volts.

At time t1, signal Clk clocks high. When Clk is high, comparator 20 may be placed in a linear amplification mode that amplifies any voltage difference between Vin_diff and Vref_diff<k> (i.e., comparator 20 may preamplify Vid during the high clock phase). In this example, Vid is greater than zero volts during the high clock phase so the comparator should eventually latch a high data signal.

At time t2, signal Clk clocks low. When Clk is low, comparator 20 may be placed in an exponential amplification mode that drives an internal output node in comparator 20 to logic "1" if the preamplified voltage signal is positive or to logic "0" if the preamplified voltage signal is negative. The exponential amplification mode may sometimes be referred to as an exponential regeneration phase (e.g., comparator 20 may include gain circuits connected in a positive feedback configuration, which can help drive signals to logic high/low). At time t3 (when Clk rises again), the regenerated data may be latched at the output of comparator 20 (e.g., Vout is latched high). Prior to latching valid data, Vout may have an unknown voltage (see, e.g., Vout prior to time t3).

For the remainder of the high clock phase immediately following time t3, a subsequent data comparison may be performed. As shown in this example, only one clock cycle is required to obtain new valid data (e.g., a half clock cycle for preamplification and a half clock cycle for regeneration). In this example, new data may be latched at each rising edge of signal Clk. Comparator 20 may be used during normal operation of A/D converter 16 to perform data comparisons in real time.

Figure 7:
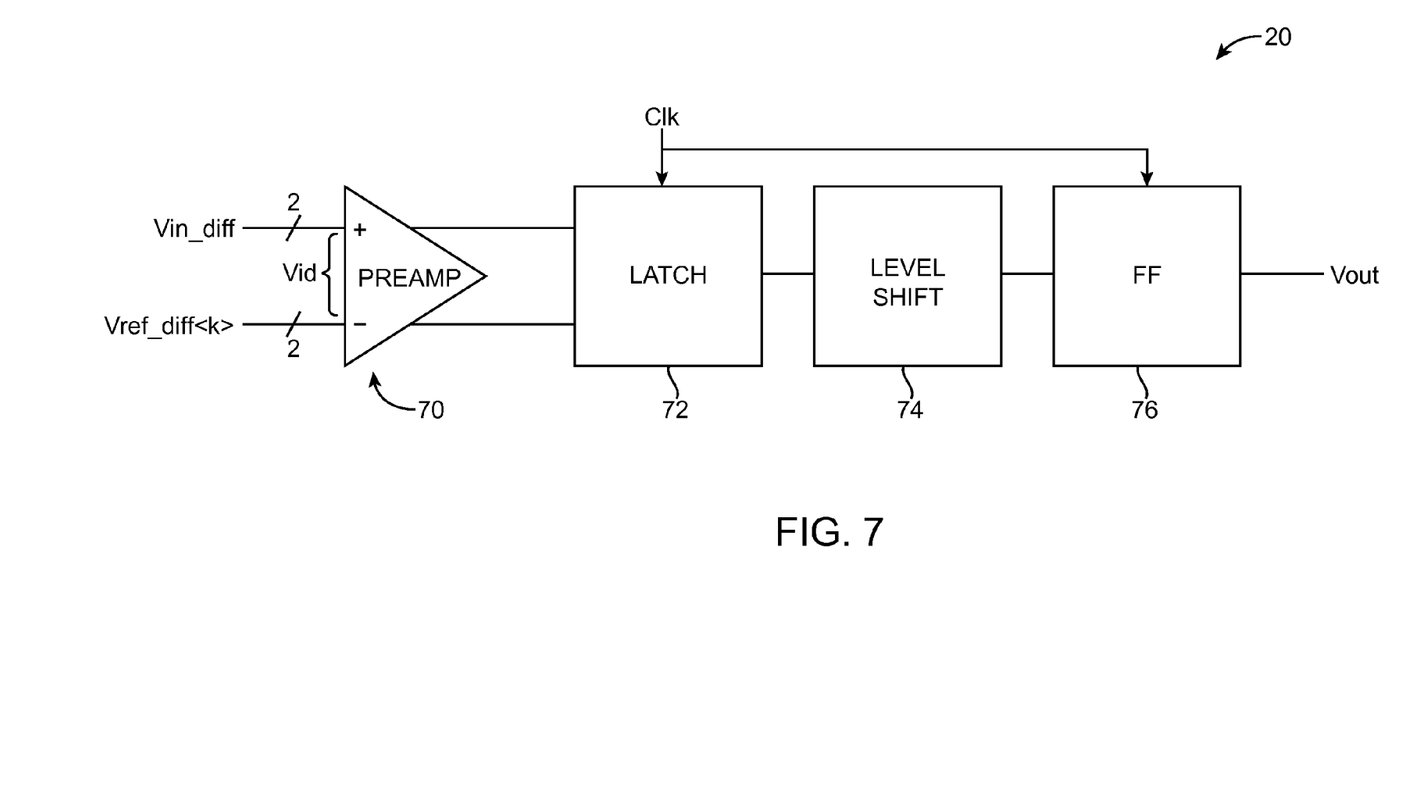
FIG. 7 is a diagram of an illustrative latched comparator circuit having a preamplifier stage and a latching stage in accordance with an embodiment of the present invention.

Latched comparator 20 may include several different circuits coupled in a chain (see, e.g., FIG. 7). As shown in FIG. 7, comparator 20 may include at least a preamplifier 70, a latching circuit 72, a level shifting circuit 74, and a flip-flop 76. Preamplifier 70 may have a first (positive) input that serves as the first input of comparator 20 (e.g., for receiving Vin_diff), a second (negative) input that serves as the second input of comparator 20 (e.g., for receiving Vref_diff<k>), and a differential output. The differential output of preamplifier 70 may be coupled to inputs of latch 72.

Preamplifier 70 may serve to perform linear amplification on Vid, whereas latch 72 may serve to perform exponential regeneration on the amplified versioned of Vid. The regenerated signal may be fed through level shifter 74 and may then be latched using flip-flop 76 (e.g., a negative-edge-triggered flip-flop). Signal Vout may be presented at the output of flip-flop 76. Preamplifier 70 may be designed to exhibit reduced offset by forming relatively large input transistors, because it is generally easier to fabricate large matching transistors as opposed to minimum sized matching transistors. Moreover, preamplifier 70 may serve to further reduce the input-referred offset associated with latch 72 by the gain of preamplifier 70.

The use of preamplifier 70 prior to latching circuit 72 may also serve to reduce kickback noise. Kickback noise may be caused by parasitic capacitive coupling generated when latching signal Clk rises high or falls low. Because preamplifier 70 does not include any transistor that is controlled using Clk, preamplifier 70 effectively isolates the input of comparator 20 from any undesired Clk activity that is present in latching circuit 72, thereby minimizing kickback.

Figure 8:
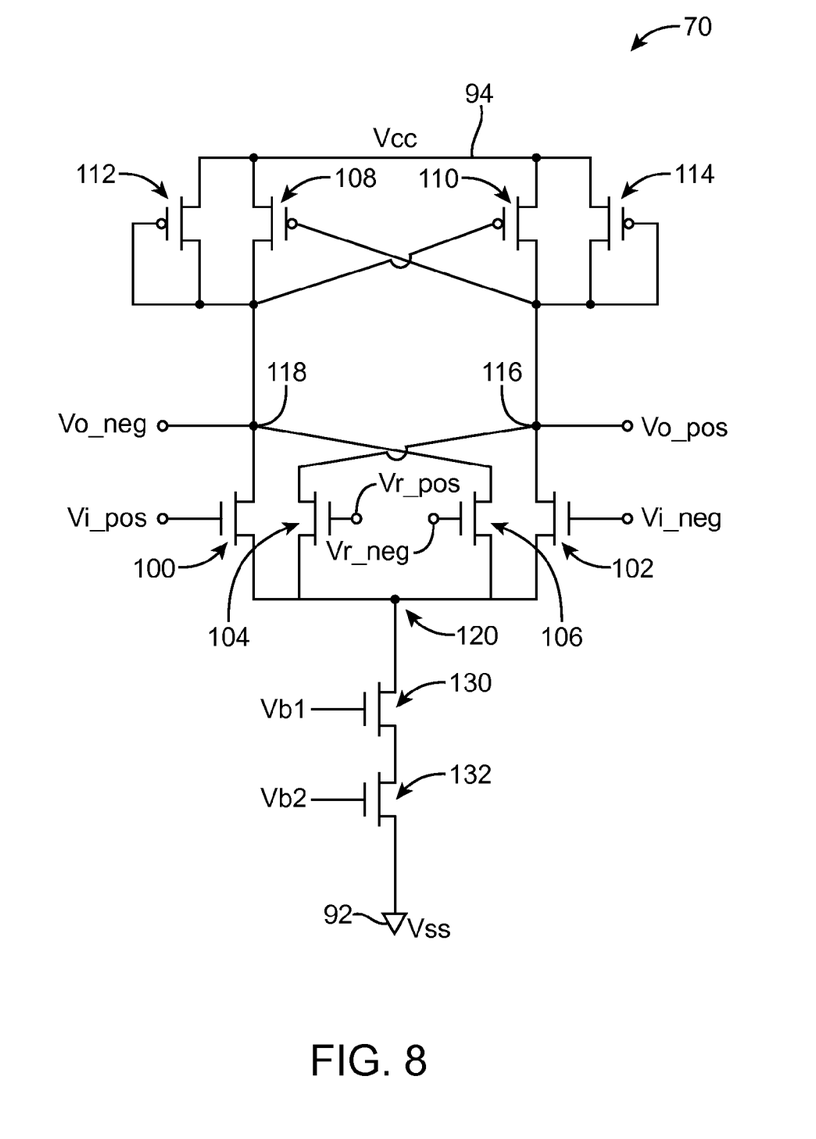
FIG. 8 is a circuit diagram of an illustrative preamplifier circuit in accordance with an embodiment of the present invention.

FIG. 8 is a circuit diagram of preamplifier 70. Preamplifier 70 may have a first set of inputs (described collectively as the positive input of preamplifier 70 in FIG. 7) at which Vi_pos and Vi_neg are received and a second set of inputs (described collectively as the negative input of preamplifier 70 in FIG. 7) at which Vr_pos and Vr_neg are received. The difference between Vi_pos and Vi_neg represents Vin_diff, whereas the difference between Vr_pos and Vr_neg represents Vref_diff<k>. Preamplifier 70 may also have first output node 116 and second output node 118 at which output voltages Vo_pos and Vo_neg are provided, respectively. Preamplifier output nodes 116 and 118 may serve as the differential output of preamplifier 70.

Preamplifier 70 may include n-channel devices (e.g., n-channel metal-oxide-semiconductor transistors) such as n-channel transistors 100, 102, 104, 106, 130, and 132 and p-channel devices (e.g., p-channel metal-oxide-semiconductor transistors) such as p-channel transistors 108, 110, 112, and 114. P-channel transistors 108 and 112 may each have source-drain terminals that are coupled between power supply line 94 and preamplifier output node 118 (e.g., transistors 108 and 112 may be coupled in parallel between line 94 and node 118). Transistors 110 and 114 may each have source-drain terminals that are coupled between power supply line 94 and preamplifier output node 116 (e.g., transistors 110 and 114 may be coupled in parallel between line 94 and node 116). Transistor 108 may have a gate that is coupled to output node 116, whereas transistor 110 may have a gate that is coupled to output node 118. Cross-coupling p-channel transistors 108 and 110 in this way maximizes the gain of preamplifier 70.

Transistor 112 may have a gate that is coupled to output node 118, and transistor 114 may have a gate that is coupled to output node 116. Transistors 112 and 114 in which the gate and drain terminals are shorted may sometimes be referred to as "diode-connected" transistors. Forming output load transistors 112 and 114 in the diode-connected configuration may reduce the high frequency (small signal) impedance at output nodes 116 and 118, which can also help reduce kickback noise from latch 72.

N-channel transistor 100 may have a drain terminal that is coupled to output node 118, a source terminal that is coupled to tail node 120, and a gate that is controlled by Vi_pos. Transistor 102 may have a drain terminal that is coupled to output node 116, a source terminal that is coupled to tail node 120, and a gate that is controlled by Vi_neg. Transistor 104 may have a drain terminal that is coupled to output node 116, a source terminal that is coupled to tail node 120, and a gate that is controlled by Vr_pos. Transistor 106 may have a drain terminal that is coupled to output node 118, a source terminal that is coupled to tail node 120, and a gate that is controlled by Vr_neg. Transistors 100, 102, 104, and 106 may serve as input transistors for preamplifier 70 and may be relatively large transistors (e.g., compared to p-channel transistors 108 and 112) such that preamplifier offset is minimized.

N-channel transistors 130 and 132 may be coupled in series between tail node 120 and ground line 92. Transistors 130 may have a gate that receives first bias voltage Vb1, whereas transistors 132 may have a gate that receives second bias voltage Vb2. Voltages Vb1 and Vb2 may be configured such that the current flowing through transistors 130 and 132 can provide sufficient gain for preamplifier 70. Stacking (or "cascoding") transistors 130 and 132 in this way can also help increase the high frequency impedance at tail node 12, further stabilizing the operation of preamplifier 70.

Figure 9:
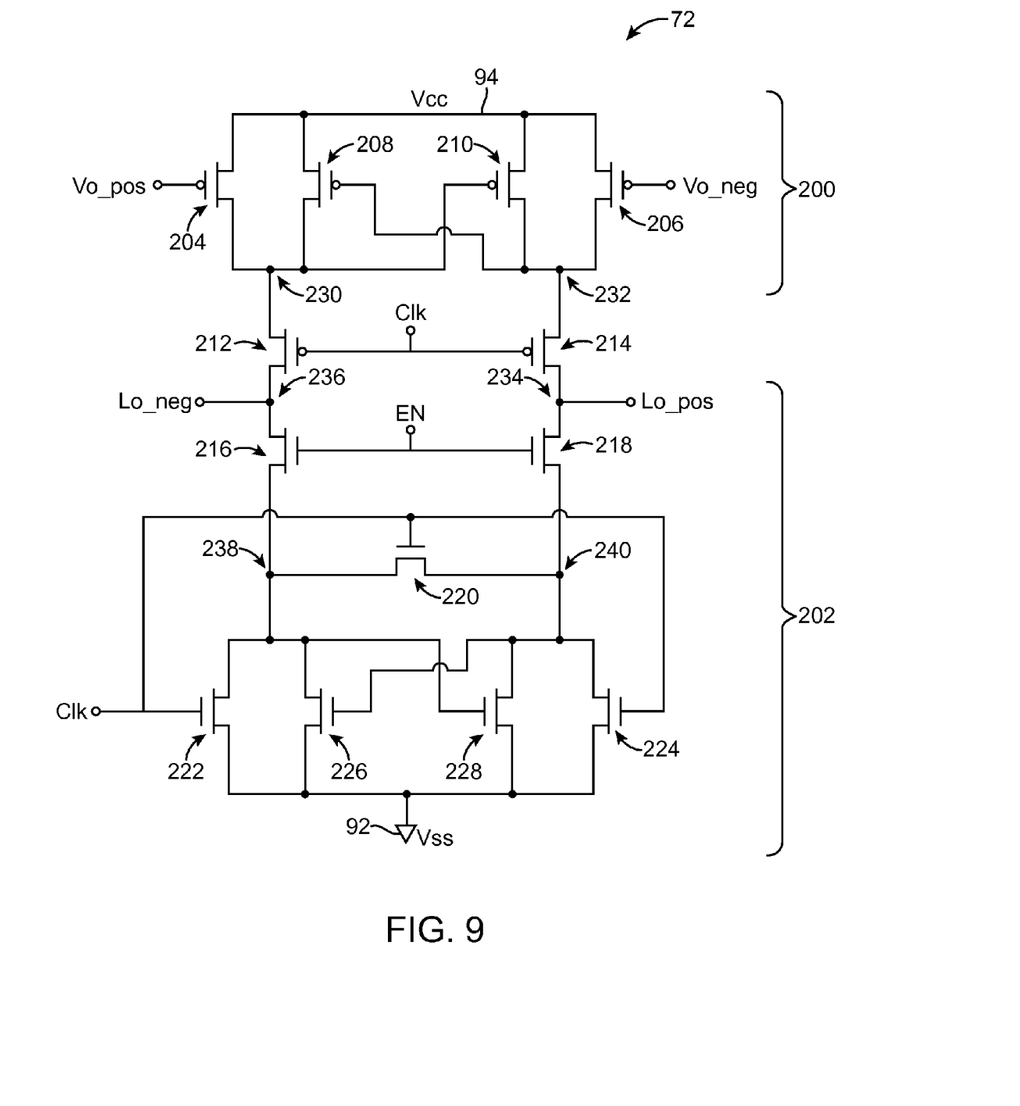
FIG. 9 is a circuit diagram of an illustrative regenerative latching circuit in accordance with an embodiment of the present invention.

FIG. 9 is a circuit diagram of latch (sometimes referred to as the regenerative stage) 72. Latch 72 may have a first input configured to receive signal Vo_pos from output node 116 of preamplifier 70, a second input configured to receive signal Vo_neg from output node 118 of preamplifier 70, and a control input configured to receive signal Clk. Latch 72 may also have first output node 234 and second output node 236 at which latch output voltages Lo_pos and Lo_neg are provided, respectively. Latch output nodes 234 and 236 may serve as a differential output for latch 72.

Latch 72 may be operable in first and second modes. When signal Clk is high, circuit 72 may be placed in a first (idle) mode in which latch 72 is configured to precharge its output nodes to a predetermined voltage level (as an example). During this time, preamplifier 70 performs linear amplification on Vid and presents the preamplified version of Vid at the first and second inputs of latch 72. When signal Clk is low, circuit 72 may be placed in a second (active) mode in which latch 72 is configured to exponentially regenerate any voltage difference between Vo_pos and Vo_neg. For example, if Vo_pos is greater than Vo_neg, latch 72 may drive Lo_pos to Vcc and Lo_neg to ground. As another example, if Vo_pos is less than Vo_neg, latch 72 may drive Lo_pos to ground and Lo_neg to Vcc.

Latching circuit 72 may include a first latch portion 200 and a second latch portion 202. Transistors controlled by signal Clk may bridge the first and second portions. During the first idle latch mode, the first and second portions may be decoupled from one another (e.g., so that selected precharge transistors are turned on). During the second mode, the first and second portions may be electrically connected to provide desired exponential regeneration (while the precharge transistors are turned off).

First portion 200 of latch 72 may include p-channel transistors 204, 206, 208, and 210, whereas second portion 202 of latching circuit 72 may include n-channel transistors 216, 218, 220, 222, 224, 226, and 228. Transistors 212 and 214 may serve to bridge the first and second portions. Transistor 212 and 214 may be p-channel transistors (as an example). Transistors 204 and 208 may have source terminals that are coupled to power supply line 94 and drain terminals that are coupled to first intermediate node 230, whereas transistors 206 and 210 may have source terminals that are coupled to power supply line 94 and drain terminals that are coupled to second intermediate node 232. Transistor 204 may have a gate that receives signal Vo_pos, whereas transistor 206 may have a gate that receives signal Vo_neg. Transistor 208 may have a gate that is coupled to node 232, and transistor 210 may have a gate that is coupled to node 230. Cross-coupling p-channel transistors 208 and 210 in this way may help provide high gain for latch 72.

P-channel transistor 212 may be coupled between node 230 and latch output node 236, whereas p-channel transistor 214 may be coupled between node 232 and latch output node 234. Transistors 212 and 214 may have gates that are controlled using signal Clk. When Clk is low, first portion 200 and second portion 202 of latch 72 may be connected to provide exponential regeneration.

Transistor 216 may be coupled between latch output node 236 and third intermediate node 238, and transistor 218 may be coupled between latch output node 234 and fourth intermediate node 240. Transistors 216 and 218 may have gates that are controlled by enable signal EN. Signal EN may be low during reset operations and may generally be held high during normal operation of comparator 20. Transistors 216 and 218 need not be used.

Transistor 220 may have a first source-drain terminal that is coupled to node 238, a second source-drain terminal that is coupled to node 240, and a gate that is controlled by signal Clk. Transistor 220 may serve to equalize the voltage level between nodes 238 and 240 when signal Clk is high.

Transistor 222 and 226 may have drain terminals that are coupled to node 238 and source terminals that are coupled to ground line 92. Transistors 224 and 228 may have drain terminals that are coupled to node 240 and source terminals that are coupled to ground line 92. Transistors 222 and 224 may have gates that are controlled by signal Clk and may serve to precharge latch output voltages Lo_pos and Lo_neg (with the help of transistor 220) to zero volts when Clk is high, as an example. Transistors 222, 224, and 220 may therefore be referred to as latch precharge transistors. Transistor 226 may have a gate that is coupled to node 240, whereas transistor 228 may have a gate that is coupled to node 238. N-channel transistors 226 and 228 cross-coupled using this arrangement may help provide high gain for latch 72. Cross-coupled pull-up transistors 208 and 210 and cross-coupled pull-down transistors 226 and 228 collectively form two inverting circuits that are coupled in a positive feedback configuration. A pair of cross-coupled inverting circuits may serve to provide exponential regeneration for latch 72.

Figure 10:
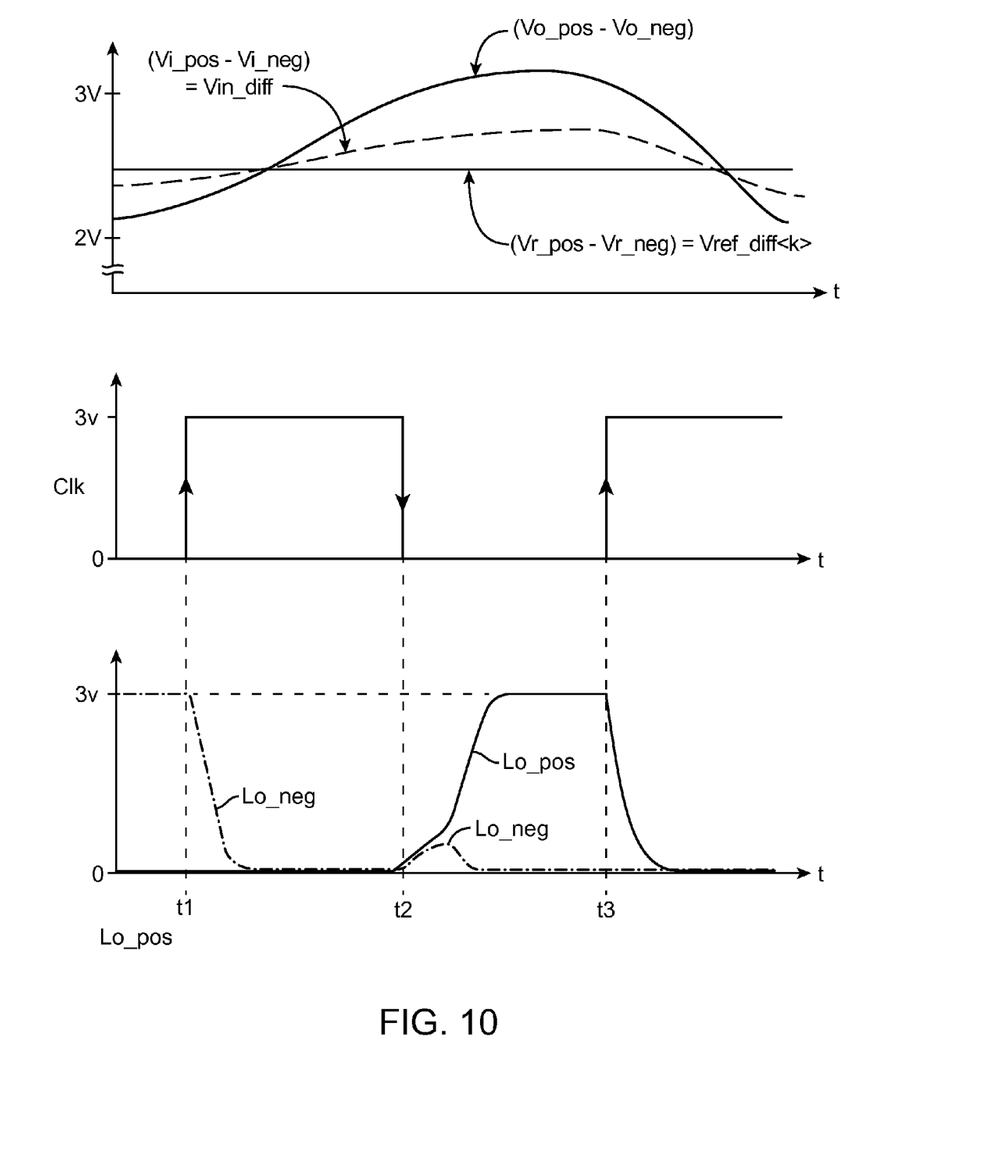
FIG. 10 is a timing diagram showing relevant waveforms during operation of the preamplifier circuit of FIG. 8 and the regenerative latching circuit of FIG. 9 in accordance with an embodiment of the present invention.

FIG. 10 is a timing diagram that further illustrates the operation of latched comparator 20. As shown in FIG. 10, Vin_diff (i.e., Vi_pos minus Vi_neg) may vary in time while Vref_diff<k> stays fixed at a constant value (for a particular comparator 20). Preamplifier 70 may be used to amplify the difference between Vin_diff and Vref_diff<k> so preamplifier output differential voltage (i.e., Vo_pos minus Vo_neg) swings between 2 V and 3 V (assuming Vcc is equal to 3 V in this example).

At time t1, signal Clk may rise high, triggering latch to precharge both signals Lo_pos and Lo_neg to zero volts. From time t1 to t2, preamplifier 70 may be used to generate amplified differential voltage (Vo_pos minus Vo_neg) at the input of latch 72. At time t2, signal Clk falls low and latch 72 is placed in active mode. When placed in the active mode, latch 72 regenerates the amplified differential voltage by providing exponential amplification, which drives the latch output signals either high or low (e.g., latch 72 will amplify any voltage difference at its input so that its output will be driven to logic "1" or logic "0"). In the example of FIG. 10, Lo_pos is driven to Vcc and Lo_neg is driven to Vss because the difference between Vin_diff and Vref_diff<k> is positive at least during the sensing time period between t1 and t2. At time t3, Clk rises again to precharge the latch output voltages in preparation for sensing a subsequent data point.

In this example, level shift circuit 74 may receive latch output voltage signals Lo_pos and Lo_neg from latch 72 and downshift the signals from 3 V to 1 V (as an example). If desired, level shifter 74 may perform any desired voltage up-conversion or down-conversion. The level-converted voltage may then be fed to flip-flop 76 and may be latched at each rising clock edge of Clk (e.g., at time t3).

Details of latched comparator 20 described in connection with FIGS. 6-10 are merely illustrative and do not serve to limit the scope of the present invention. If desired, other types of preamplification circuit may be used, any number of preamplifying stages may be used, other types of latching stages having more than less than two pairs of cross-coupled transistors may be used, other types of clocking schemes may be used, etc.

The foregoing is merely illustrative of the principles of this invention and various modifications can be made by those skilled in the art without departing from the scope and spirit of the invention. The foregoing embodiments may be implemented individually or in any combination.

What is claimed is:

1. A comparator circuit comprising:
   an amplifier having an output; and
   a latching circuit having an input coupled to the output of the amplifier, wherein the latching circuit includes a first transistor that is coupled between a first power supply line and a first node, a second transistor that is coupled between the first power supply line and a second node, a third transistor that is coupled between the first and second nodes and that receives a clock signal, a first input transistor that is coupled in series with the first transistor, a second input transistor that is coupled in series with the second transistor, and an additional transistor that is coupled in series between the first transistor and the first input transistor and that has a gate that receives a control signal that is different than the clock signal, wherein the first transistor has a gate that is coupled to the second node, wherein the second transistor has a gate that is coupled to the first node, and wherein the first and second input transistors have gates that receive signals generated at the output of the amplifier.

2. The comparator circuit defined in claim 1 wherein the latching circuit further comprises:
   a fourth transistor that is coupled between a second power supply line and a third node; and
   a fifth transistor that is coupled between the second power supply line and a fourth node, wherein the first and second power supply lines are configured to carry different power supply voltage levels, wherein the fourth transistor has a gate that is coupled to the fourth node and wherein the fifth transistor has a gate that is coupled to the third node.

3. The comparator circuit defined in claim 2 wherein the latching circuit further comprises:
   a sixth transistor interposed between the first and third nodes; and
   a seventh transistor interposed between the second and fourth nodes, wherein the sixth and seventh transistors each have a gate operable to receive the clock signal.

4. The comparator circuit defined in claim 2 wherein the first input transistor is coupled in parallel with the fourth transistor and wherein the second input transistor is coupled in parallel with the fifth transistor.

5. The comparator circuit defined in claim 1 wherein the latching circuit further comprises:
   a fourth transistor that is coupled between the first power supply line and the first node; and a fifth transistor that is coupled between the first power supply line and the second node, wherein the fourth and fifth transistors each have a gate operable to receive the clock signal.

6. The comparator circuit defined in claim 1 wherein the comparator circuit comprises one comparator circuit in a plurality of comparator circuits that form part of an analog-to-digital converter on an integrated circuit.

7. The comparator circuit defined in claim 6 wherein the comparator circuit is coupled between a digital-to-analog converter and an encoder in the analog-to-digital converter.

8. The comparator circuit defined in claim 1 further comprising:
   a level shifting circuit coupled to an output of the latching circuit; and
   a flip-flop coupled to an output of the level shifting circuit.

9. Latch circuitry, comprising:
   a power supply terminal;
   a first transistor that is coupled between the power supply terminal and a first node;
   a second transistor that is coupled between the power supply terminal and a second node;
   a third transistor that is coupled between the first node and the second node, wherein the first, second, and third transistors are controlled by a clock signal;
   a fourth transistor that is coupled to the first node; and
   a fifth transistor that is coupled to the second node, wherein the fourth and fifth transistors are controlled by an enable signal.

10. The latch circuitry defined in claim 9, further comprising:
   a sixth transistor that is coupled in parallel with the first transistor and that has a gate terminal that is coupled to the second node; and
   a seventh transistor that is coupled in parallel with the second transistor and that has a gate terminal that is coupled to the first node.

11. The latch circuitry defined in claim 9, further comprising:
   a sixth transistor that is coupled in series with the fourth transistor; and
   a seventh transistor that is coupled in series with the fifth transistor, wherein the sixth and seventh transistors are controlled by the clock signal.

12. The latch circuitry defined in claim 11, wherein the first and second transistors comprise transistors of a first channel type, and wherein the sixth and seventh transistors comprise transistors of a second channel type that is different than the first channel type.

13. The latch circuitry defined in claim 11, further comprising:
   an eighth transistor that is coupled in series with the sixth transistor; and
   a ninth transistor that is coupled in series with the seventh transistor, wherein the eighth and ninth transistors have gate terminals that serve as inputs for the latch circuitry.

14. A method of operating a comparator that includes an amplifying circuit and a latching circuit, comprising:
   amplifying a signal with the amplifying circuit;
   receiving the amplified signal from the amplifying circuit with the latching circuit, wherein the latching circuit includes a first latch portion, a second latch portion, and first and second output terminals coupled between the first and second latch portions;
   asserting a clock signal to short the first and second output terminals of the latching circuit; and
   asserting an enable signal to short the first latch portion to the second latch portion.

15. The method defined in claim 14, wherein the first latch portion includes a first pair of cross-coupled transistors of a first channel type, and wherein the second latch portion includes a second pair of cross-coupled transistors of a second channel type that is different than the first channel type.

16. The method defined in claim 15, further comprising:
   deasserting the clock signal to decouple the first latch portion from the second latch portion.

* * * * *